(12) United States Patent
Zhu

(10) Patent No.: US 11,637,556 B2
(45) Date of Patent: Apr. 25, 2023

(54) METHOD AND SYSTEM FOR PROVIDING WORD ADDRESSABLE NONVOLATILE MEMORY IN A PROGRAMMABLE LOGIC DEVICE

(71) Applicant: GOWIN Semiconductor Corporation, GuangZhou (CN)

(72) Inventor: Jinghui Zhu, San Jose, CA (US)

(73) Assignee: GOWIN SEMICONDUCTOR CORPORATION, Guangzhou (CN)

( * ) Notice: Subject to any disclaimer, the term of this patent is extended or adjusted under 35 U.S.C. 154(b) by 0 days.

(21) Appl. No.: 17/225,022

(22) Filed: Apr. 7, 2021

(65) Prior Publication Data

US 2021/0281264 A1    Sep. 9, 2021

Related U.S. Application Data

(63) Continuation of application No. 16/813,431, filed on Mar. 9, 2020, now Pat. No. 10,992,299.

(51) Int. Cl.
*H03K 19/1776* (2020.01)
*H03K 19/17724* (2020.01)
*H03K 19/17736* (2020.01)
*G11C 11/22* (2006.01)
*G11C 16/10* (2006.01)
(Continued)

(52) U.S. Cl.
CPC ...... *H03K 19/1776* (2013.01); *G11C 11/1675* (2013.01); *G11C 11/2275* (2013.01); *G11C 13/0004* (2013.01); *G11C 13/0069* (2013.01); *G11C 16/10* (2013.01); *H03K 19/17724* (2013.01); *H03K 19/17736* (2013.01)

(58) Field of Classification Search
CPC ....... H03K 19/0715; H03K 19/017509; H03K 19/17724; H03K 19/17736; H03K 19/1776; G11C 16/10; G11C 11/16; G11C 11/1675; G11C 11/2275; G11C 11/55678; G11C 13/0004; G11C 13/004; G11C 13/0069

See application file for complete search history.

(56) References Cited

U.S. PATENT DOCUMENTS

| | | | |
|---|---|---|---|
| 7,190,190 B1 * | 3/2007 | Camarota | G11C 7/20 326/38 |
| 7,495,970 B1 * | 2/2009 | Tang | G11C 29/028 365/189.08 |
| 9,059,705 B1 * | 6/2015 | Edelhaeuser | G11C 11/5692 |

(Continued)

*Primary Examiner* — Jason Crawford
(74) *Attorney, Agent, or Firm* — JW Law Group; James M. Wu

(57) ABSTRACT

A programmable integrated circuit device able to be selectively programmed to perform one or more logic functions includes multiple configurable logic blocks ("LBs"), routing fabric, and a nonvolatile memory ("NVM"). While the configurable LBs are able to be selectively programmed to perform one or more logic functions, the routing fabric selectively routes information between the configurable LBs and input/output ports based on a routing configuration signals. The NVM, such as magnetoresistive random access memory ("MRAM"), phase-change memory, or ferroelectric RAM ("FeRAM"), is flexibly organized to contain a configuration NVM storage and a user NVM storage, wherein the user NVM storage is a word addressable memory capable of facilitating random memory access.

17 Claims, 10 Drawing Sheets

(51) Int. Cl.
  *G11C 11/16* (2006.01)
  *G11C 13/00* (2006.01)

(56) References Cited

U.S. PATENT DOCUMENTS

| | | | |
|---|---|---|---|
| 9,437,260 B2* | 9/2016 | Prenat | H03K 19/17764 |
| 10,992,299 B1* | 4/2021 | Zhu | G11C 16/10 |
| 2014/0103958 A1* | 4/2014 | Ikeda | H03K 19/0008 |
| | | | 326/38 |
| 2016/0274816 A1* | 9/2016 | Zhu | G06F 9/44505 |
| 2019/0253056 A1* | 8/2019 | Lin | H01L 25/18 |
| 2019/0363715 A1* | 11/2019 | Lee | H03K 19/017581 |
| 2020/0082885 A1* | 3/2020 | Lin | G11C 11/54 |
| 2021/0281264 A1* | 9/2021 | Zhu | H03K 19/1776 |
| 2022/0083094 A1* | 3/2022 | Liu | G06F 1/06 |

* cited by examiner

METHOD AND SYSTEM FOR PROVIDING
WORD ADDRESSABLE NONVOLATILE
MEMORY IN A PROGRAMMABLE LOGIC
DEVICE

PRIORITY

This application is a continuation of a U.S. patent application having an application Ser. No. 16/813,431, filed on Mar. 9, 2020, and entitled "Method and System for Providing Word Addressable Nonvolatile Memory in A Programmable Logic Device," which has been issued into a U.S. Pat. No. 10,992,299 on Apr. 27, 2021, which is hereby incorporated herein by reference.

FIELD

The exemplary embodiment(s) of the present invention relates to the field of programmable semiconductor devices for computer hardware and software. More specifically, the exemplary embodiment(s) of the present invention relates to random accessible nonvolatile memory in a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with processing capabilities is constantly in demand. To meet such demand, high-speed and flexible semiconductor chips are generally more desirable. Once conventional approach to satisfy such demand is to use dedicated custom integrated circuits and/or application-specific integrated circuits ("ASICs") to fulfil such needs. A shortcoming with ASIC approach is that it lacks flexibility while consumes a large amount of resources.

An alternative conventional approach, which enjoys the growing popularity, is utilizing programmable semiconductor devices ("PSDs") such as programmable logic devices ("PLDs") or field programmable gate arrays ("FPGAs"). A feature of PSD is that it allows an end user to program one or more desirable functions to suit his/her applications after the PSD is fabricated.

A drawback, however, associated with a conventional FPGA or PLD is that such FPGA or PLD is typically susceptible to information loss after removal of power supply.

SUMMARY

On embodiment of the present invention discloses a configurable semiconductor device containing configurable logic blocks ("LBs"), routing fabric, and a nonvolatile memory ("NVM"). While the configurable LBs are able to be selectively programmed to perform one or more logic functions, the routing fabric optionally routes information between the configurable LBs and input/output ports based on a routing configuration signals. The NVM, such as magnetoresistive random access memory ("MRAM"), phase-change memory, or ferroelectric RAM ("FeRAM"), is flexibly organized to contain a configuration storage and a user NVM storage, wherein the user NVM storage is a word addressable memory capable of facilitating random memory access.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
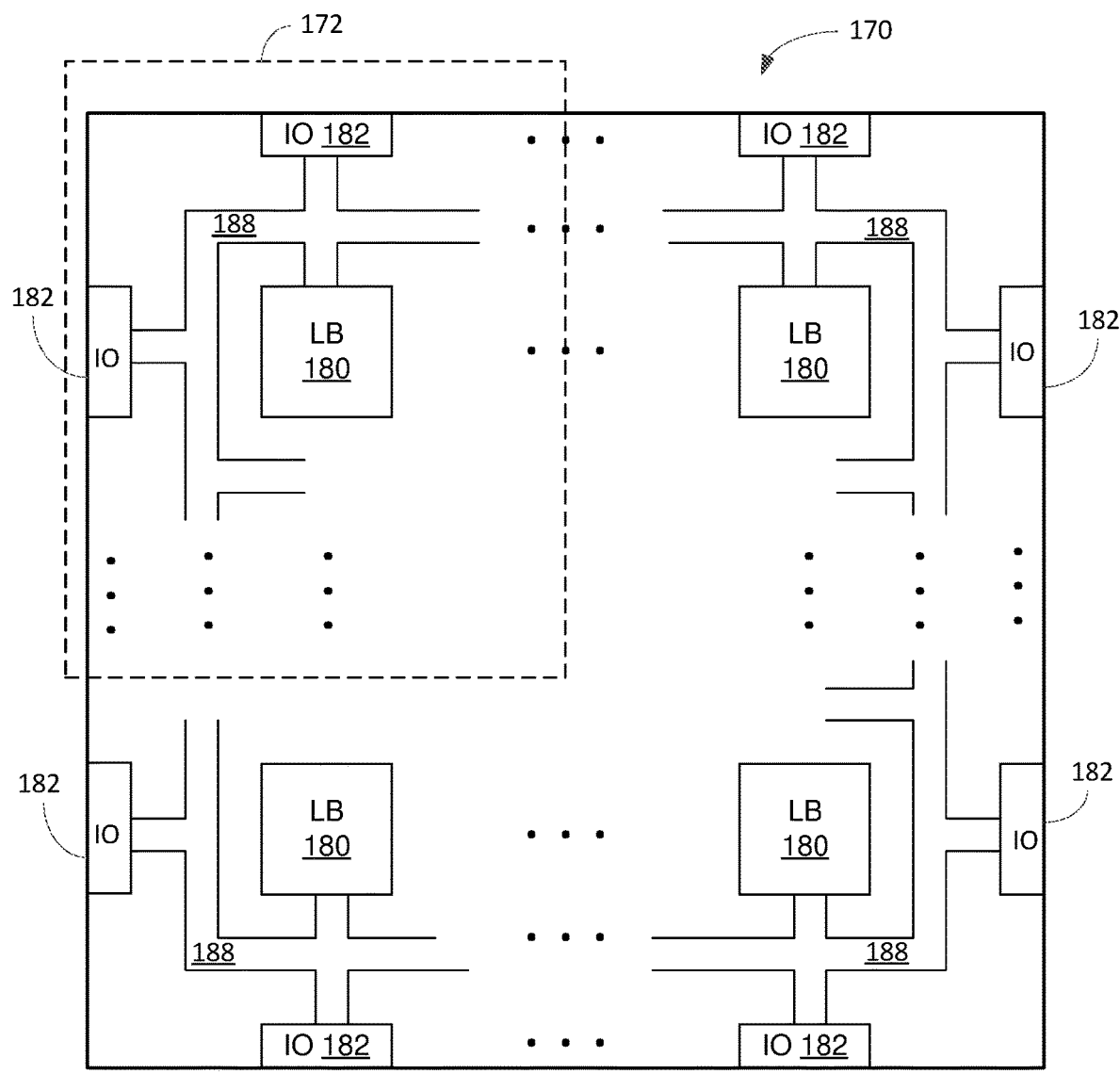
FIGS. 1A-1B are block diagrams illustrating a programmable semiconductor device ("PSD") containing word addressable NVM ("WAN") storages for random access storage in accordance with one embodiment of the present invention.

Embodiments of the present invention disclose a method (s) and/or apparatus for providing a programmable semiconductor device ("PSD") capable of retaining information persistently via a word addressable NVM ("WAN").

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as, but not limited to, magnetoresistive random access memory ("MRAM"), phase-change memory, or ferroelectric RAM ("FeRAM"), flash memory, ROM (Read Only Memory), PROM (Programmable Read Only Memory), EEPROM (Electrically Erasable Programmable Read Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the present disclosure discloses PSD containing configurable LBs, routing fabric, and NVM wherein the NVM is a word addressable NVM ("WAN"). The PSD can be a chip, IC chip, semiconductor die, or a module. While the configurable LBs are able to be selectively programmed to perform one or more logic functions, the routing fabric can optionally route information between the configurable LBs and input/output ports based on a routing configuration signals. The NVM, in one embodiment, is MRAM, phase-change memory, or ferroelectric RAM ("FeRAM") can retain data persistently. In one aspect, the capacity or size of NVM used for storing user data can be flexibly organized depending on the bit stream(s) from the user. Alternatively, the lookup tables ("LUTs") in the configurable LBs use NVM whereby the configured LUTs can be retained persistently even after the power is turned off. In one embodiment, the user NVM storage is a word addressable memory capable of facilitating random memory access.

FIG. 1A is a block diagram 170 illustrating a simplified PSD containing a WAN configured for the user memory in accordance with one embodiment of the present invention. PSD, also known as FPGA or a type of Programmable Logic Device ("PLD"), includes a WAN designated as configurable memory or WAN storage for facilitating configuring the LBs. In one aspect, PSD also includes a second portion WAN allocated for random memory access as user storage. It should be noted that the underlying concept of the exemplary embodiment(s) of the present invention would not change if one or more blocks (circuit or elements) were added to or removed from diagram 170.

PSD includes an array of configurable LBs 180 surrounded by input/output blocks ("IOs") 182, and programmable interconnect resources 188 ("PIR") that include vertical interconnections and horizontal interconnections extending between the rows and columns of LB 180 and IO 182. PRI 188 may further include interconnect array decoders ("IAD") or programmable interconnection array ("PIA"). It should be noted that the terms PRI, IAD, and PIA may be used interchangeably hereinafter.

Each LB includes programmable combinational circuitry and selectable output registers programmed to implement at least a portion of a user's logic function. The programmable interconnections, connections, or channels of interconnect resources are configured using various switches to generate signal paths between the LBs 180 for performing logic functions. Each IO 182 is programmable to selectively use an I/O pin (not shown) of PSD.

PSD, in one embodiment, can be divided into multiple programmable partitioned regions ("PPRs") 172 wherein each PPR 172 includes a portion of LBs 180, some PPRs 188, and IOs 182. A benefit of organizing PSD into multiple PPRs 172 is to optimize management of storage capacity, power supply, and/or network transmission.

Figure 1B:
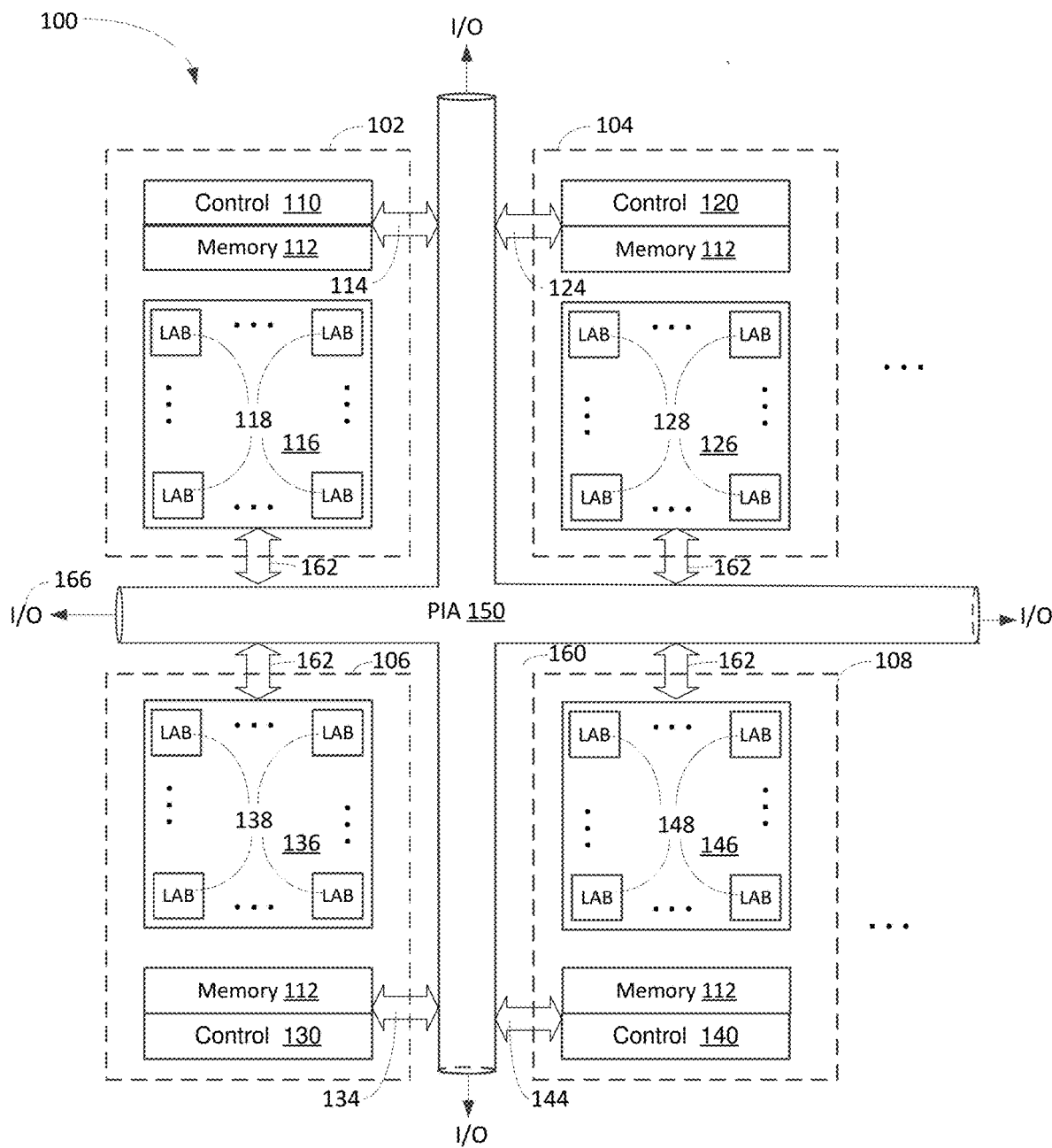

FIG. 1B is a block diagram 100 illustrating a portion of PSD containing multiple PPRs and WAN in accordance with one embodiment of the present invention. Diagram 100 includes multiple PPRs 102-108, a PIA 150, and regional I/O ports 166. PPRs 102-108 further includes control units 110, 120, 130, 140, memory 112 and LBs 116, 126, 136, 146. Note that control units 110, 120, 130, 140 can be configured into one single control unit, and similarly, memory 112 can also be configured into one single memory for storing configurations. It should be noted that the underlying concept of the exemplary embodiment(s) of the present invention would not change if one or more blocks (circuit or elements) were added to or removed from diagram 100.

LBs 116, 126, 136, 146, include multiple LABs 118, 128, 138, 148, wherein each LAB can be further organized to include, among other circuits, a set of programmable logical elements ("LEs") or macrocells, not shown in FIG. 1. Each LAB, in one example, may include anywhere from 32 to 512 programmable LEs. I/O pins (not shown in FIG. 1), LABs, and LEs are linked by PIA 150 and/or other buses, such as buses 162, 114, 124, 134, 144, for facilitating communication between PIA 150 and PPRs 102-108.

Each LE includes programmable circuits such as the product-term matrix, lookup tables, and/or registers. LE is also known as cell, configurable logic block ("CLB"), slice, configurable functional unit ("CFU"), and the like. Each LE can be independently configured to perform sequential and/or combinatorial logic operation(s). It should be noted that the underlying concept of PSD would not change if one or more blocks and/or circuits were added or removed from PSD.

Control units 110, 120, 130, 140, also known as configuration logics, can be a single control unit. Control unit 110, for instance, manages and/or configures individual LE in LAB 118 based on the configuring information stored in memory 112. It should be noted that some I/O ports or I/O pins are configurable so that they can be configured as input pins and/or output pins. Some I/O pins are programmed as bi-directional I/O pins while other I/O pins are programmed as unidirectional I/O pins. The control units such as unit 110 is used to handle and/or manage PSD operations in accordance with system clock signals.

LBs 116, 126, 136, 146 include multiple LABs which can be programed by the end user(s). Each LAB contains multiple LEs wherein each LE further includes one or more lookup tables ("LUTs") as well as one or more registers (or D flip-flops). Depending on the applications, LEs can be configured to perform user specific functions based on a predefined functional library facilitated by configuration software. PSD, in some applications, also includes a set fixed circuits for performing specific functions. For example, the fixed circuits include, but not limited to, processor(s), DSP (digital signal processing) unit(s), wireless transceiver(s), and so forth.

PIA 150 is coupled to LBs 116, 126, 136, 146 via various internal buses such as buses 114, 124, 134, 144, 162. In some embodiments, buses 114, 124, 134, 144, and 162 are part of PIA 150. Each bus includes channels or wires for transmitting signals. It should be noted that the terms channel, routing channel, wire, bus, connection, and interconnection are referred to the same or similar connections and will be used interchangeably herein. PIA 150 can also be used to receives and/or transmits data directly or indirectly from/to other devices via I/O pins and LABs.

Memory 112 may include multiple storage units situated across a PPR. Alternatively, memories 112 can be combined into one single memory unit in PSD. In one embodiment, memory 112 is an NVM storage unit used for both configuration as well as user memory. NVM storage unit can be, but not limited to, MRAM, flash, Ferroelectric RAM, and/or phase changing memory (or chalcogenide RAM). To simplify forgoing discussion, MRAM is used as an exemplary NVM throughout the remaining of the discussion. Depending on the applications, a portion of the memory 112 can be designated, allocated, or configured to be a block RAM ("BRAM") used for storing large amounts of data in PSD.

A function of WAN storage is to allow a user or application to read from and/or write to a storage of MRAM via a memory address. If WAN is a multiple ports memory architecture, a read operation and write operation can be performed simultaneously. Alternatively, WAN storage can also be used for LB configuration for programming LEs.

An advantage of employing a WAN is to enable storing data or intermittent result persistently in PSD (or PLD, FPGA).

Figure 2:
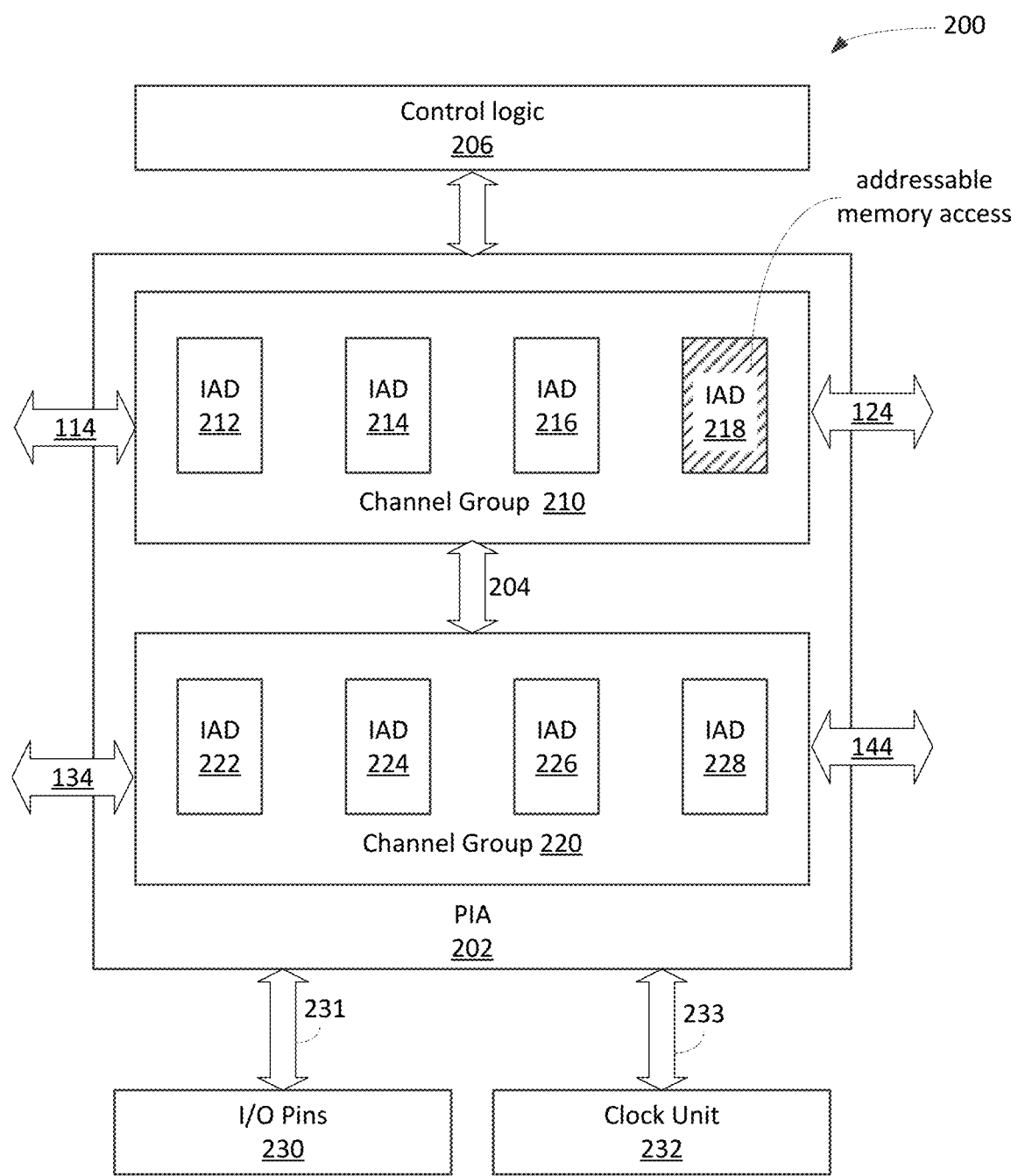
FIG. 2 is a block diagram illustrating a routing logic or routing fabric containing programmable interconnection arrays including random memory access routings in accordance with one embodiment of the present invention.

FIG. 2 is a block diagram 200 illustrating a routing logic or routing fabric containing programmable interconnection arrays including random memory access routings in accordance with one embodiment of the present invention. Diagram 200 includes control logic 206, PIA 202, I/O pins 230, and clock unit 232. Control logic 206, which may be similar to control units shown in FIG. 1B, provides various control functions including channel assignment, differential I/O standards, and clock management. Control logic 206 may contain volatile memory, non-volatile memory, and/or a combination of volatile and nonvolatile memory device for storing information such as configuration data. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, connected to PIA 202 via a bus 231, contain multiple programmable I/O pins configured to receive and/or transmit signals to external devices. Each programmable I/O pin, for instance, can be configured to input, output, and/or bi-directional pin. Depending on the applications, I/O pins 230 may be incorporated into control logic 206.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232, for example, provides clock signals to PIA 202 including reference clock(s).

PIA 202, in one aspect, is organized into an array scheme including channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218. Channel group 220 includes four IADs 222-228. A function of IAD is to provide a configurable routing resources for data transmission.

IAD such as IAD 212 includes routing multiplexers or selectors for routing signals between I/O pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 202, in one embodiment, designates a special IAD such as IAD 218 for handling WAN routing. For example, IAD 218 is designated to handle connections and/or routings between WAN storage and the LABs to facilitate data random memory access using memory addresses. It should be noted that additional IADs may be allocated for handling WAN operations.

An advantage of using IAD 218 within PIA as a designated WAN routing is to facilitate storing large amounts of information persistently in PSD or FPGA.

Figure 3:
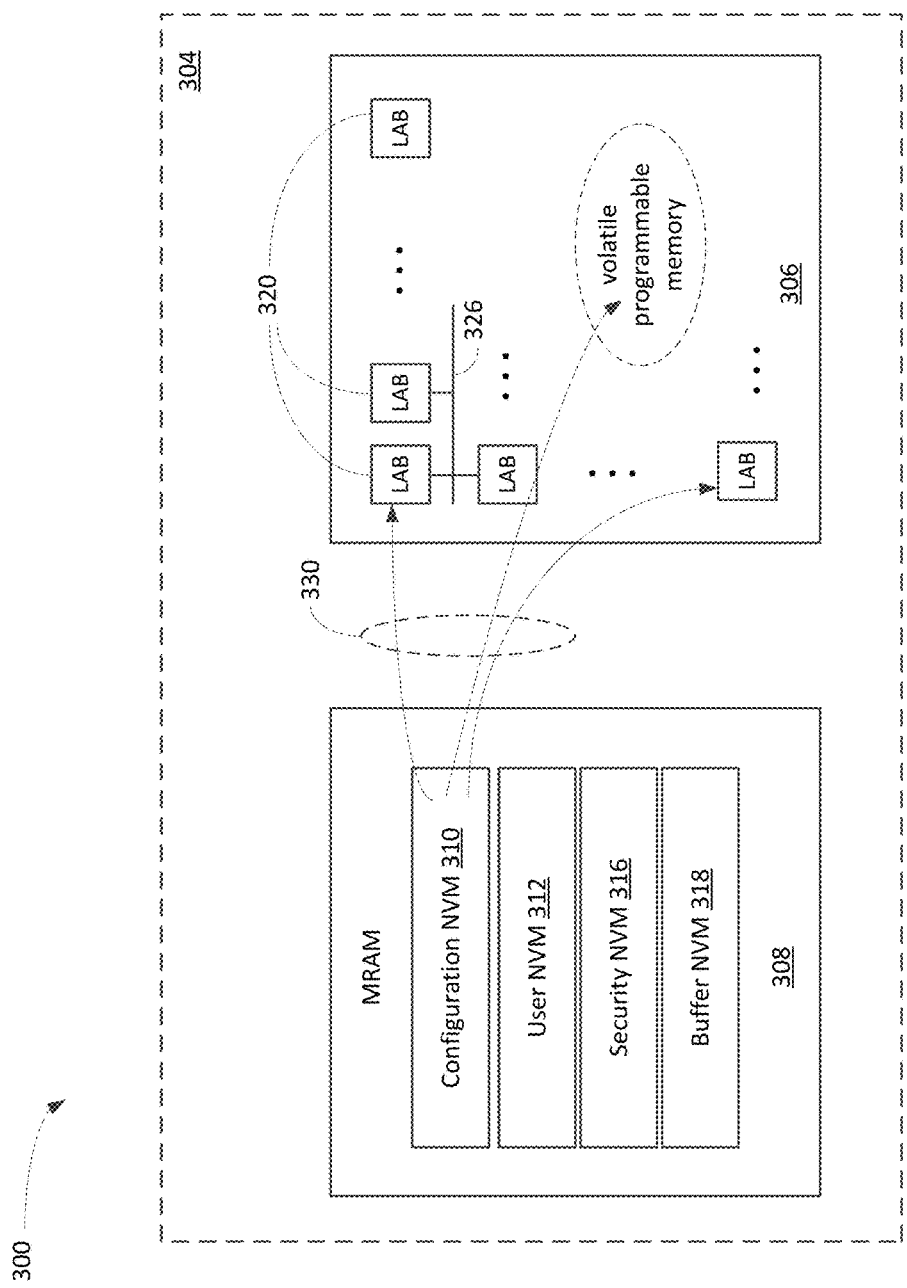
FIG. 3 is a block diagram illustrating a magnetoresistive random-access memory ("MRAM") as an NVM in PSD used for configuring various logic array blocks ("LABs") in accordance with one embodiment of the present invention.

FIG. 3 is a logic block diagram 300 illustrating PSD 304 containing MRAM 308 used for configuring various LABs 320 in accordance with one embodiment of the present invention. PSD 304, in one embodiment, is a semiconductor die, chip, or integrated circuit ("IC") containing a programmable LB 306 and MRAM block 308. Alternatively, PSD 304 can also be a semiconductor module containing one or more chips or dies. Programmable LB 306, in one example, includes various LABs 320 connected by programmable interconnections or PIA 326. It should be noted that the underlying concept of the exemplary embodiment(s) of the present invention would not change if one or more blocks (circuit or elements) were added to or removed from diagram 300.

Programmable LB 306 includes an array of LABs 320 which, in one example, is an LE, or logic cell similar to CLB, CFU, slice, LE, and the like. In one embodiment, LAB 320 includes one or more LUTs and one or more registers.

Each LUT, for example, includes a set of volatile memories such as SRAM (static RAM), RAM, or DRAM (dynamic RAM) for logic or functional configurations. In one aspect, the volatile memory is programmed by the configuration bit stream from MRAM block 308 as indicated by numeral 330.

MRAM block 308, using direction of electron spin to store information persistently, includes a configuration NVM 310, user NVM 312, security NVM 316, and buffer NVM 318. Configuration NVM 310 is the PSD boot data used to store configuration information that is used to configure the programmable logic array upon power up. For example, the volatile memory in programmable logic block 306 can be configured by the configuration information or bit stream stored in configuration NVM 310 of MRAM block 308.

User NVM 312 is used to store user data. In one aspect, the size of user NVM 312 can vary depending on the applications and/or user preferences. Security NVM 316 is a set of configurable security bits used to enable or disable port access such as in-system programming read access. Buffer NVM 318 is an optionally allocated network transmission buffer used for data transmission via wireless communication network.

In one embodiment, PSD 304 contains a programmable IC device which is selectively programmed by a user to perform one or more logic functions. The programmable IC device includes multiple configurable LBs, a routing fabric, and an NVM. While configurable LBs are selectively programmed to perform one or more logic functions, the routing fabric routes information between the configurable LBs and input/output ports based on a routing configuration signals according to the configuration information. NVM, in one embodiment, is configured to be flexibly organized to include a configuration NVM storage and a user NVM storage. The user NVM storage, in one embodiment, is a word addressable memory capable of facilitating random memory access. MRAM is capable of retaining digital information persistently. It should be noted that the word addressable memory includes multiple words wherein each word contains 32 or 64 bits. Alternatively, each word can have a bit-range from 8 bits to 256 bits. In one example, MRAM can be used as registers during mathematical computation operated by LBs.

In one embodiment, the NVM can be a phase-change memory capable of retaining digital information persistently. Alternatively, the NVM can also be a ferroelectric random-access memory ("FeRAM") capable of retaining digital information persistently. It should be noted that the writing time and read time for MRAM, FeRAM, or phase-change memory are substantially similar and/or comparable to SRAM. Also, NVM can also be a flash memory capable of retaining digital information persistently. The size of user NVM storage can vary depending on the required configuration NVM storage. It should be noted that the size of the configuration NVM storage is assigned in response to user configuration logic or bit stream.

An advantage of using the WAN in PSD is that WAN provides random memory access which allows to access memory space using memory address(es).

Figure 4:
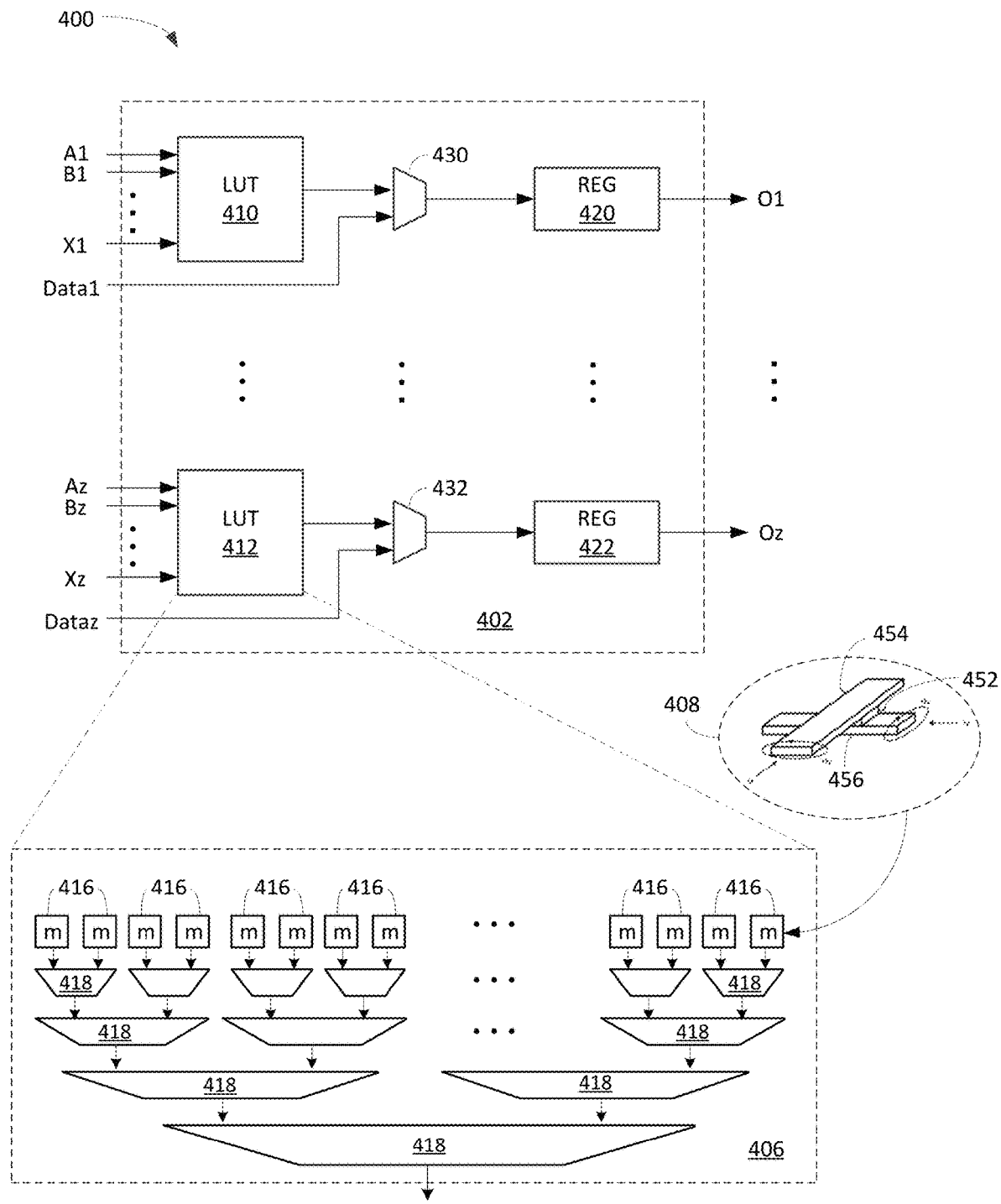
FIG. 4 is a block diagram illustrating LAB 402 containing MRAM based lookup tables ("LUTs") in accordance with one embodiment of the present invention.

FIG. 4 is a block diagram 400 illustrating LAB 402 containing MRAM based LUTs in accordance with one embodiment of the present invention. LAB 402 includes multiple LUTs 410-412, routing multiplexers 430-432, and registers 420-422. Each LUT receives a set of inputs and generates an output based on the inputs as well as functional configuration. For example, LUT 410 receives input data from terminals A1, B1, Xl, and generates an output O1 based on the input data as well as configuration value associated with LUT 410. It should be noted that the underlying concept of the exemplary embodiment(s) of the present invention would not change if one or more blocks (circuit or elements) were added to or removed from diagram 400.

IC component diagram 406 is an exploded-view of LUT 412 showing multiple memory bits, cells or units 416 and multiplexers 418 to form a configurable LUT. It should be noted that LUT 412 can have, for example, 2, 3, 4, 6, 8, 15, or 32 inputs LUT. MRAM 408 illustrates an explored view of a one-bit MRAM cell. MRAM 408 includes a memory cell 452, a word line 454, a bit line 456, and depending on the direction of electron spinning, a logic one or zero is stored.

During a write operation, a magnetization in the free layer of selected memory cell 452, for example, can be oriented by applying write currents Ix and Iy to selected word line 454 and bit line 456, which cross memory cell 452. By applying a current Ix to the word line 454, it causes a magnetic field Hy to form around the word line 454. Applying the current Iy to the bit line 456 causes a magnetic field Hx to form around bit line 456. When sufficiently large currents Ix and Iy are passed through lines 454 and 456, the combined magnetic field in the vicinity of the free layer causes the magnetization of the free layer to rotate from the parallel orientation to the anti-parallel orientation, or vice-versa. Accordingly, a logic one or logic zero is set in memory cell 452.

Depending on the applications, a large portion of LABs in PSD may be idling (or not used) after configuration. Since each LAB contains an array of MRAM bits, the LAB(s) can be reconfigured to be a user memory. A random accessible MRAM memory can be configured as a user memory since the read and write speed of MRAM is comparable to the read and write speed of SRAM.

In one embodiment, PSD or FPGA which contains MRAM based LUTs includes multiple configurable LBs and a routing fabric. The configurable LBs contains a set of MRAM LUTs capable of being selectively programmed to perform one or more logic functions. The routing fabric is configured to selectively route information between the configurable LBs and input/output ports based on a routing configuration information. MRAM, in one embodiment, is capable of retaining information persistently so that the configuration information in the MRAM based LUTs is preserved when the power supply is turned off. It should be noted that the word addressable memory can be configured to have a bit-range from 8 bits to 256 bits.

An advantage of using MRAM based LUTs or MRAM LUTs is that the LUTs can remember the configured information persistently until they are reprogrammed. Another benefit of using MRAM based LUTs is that unused LABs can be reconfigured to be a part of user memory which allows PSD to permanently store large amounts data internally.

Figure 5:
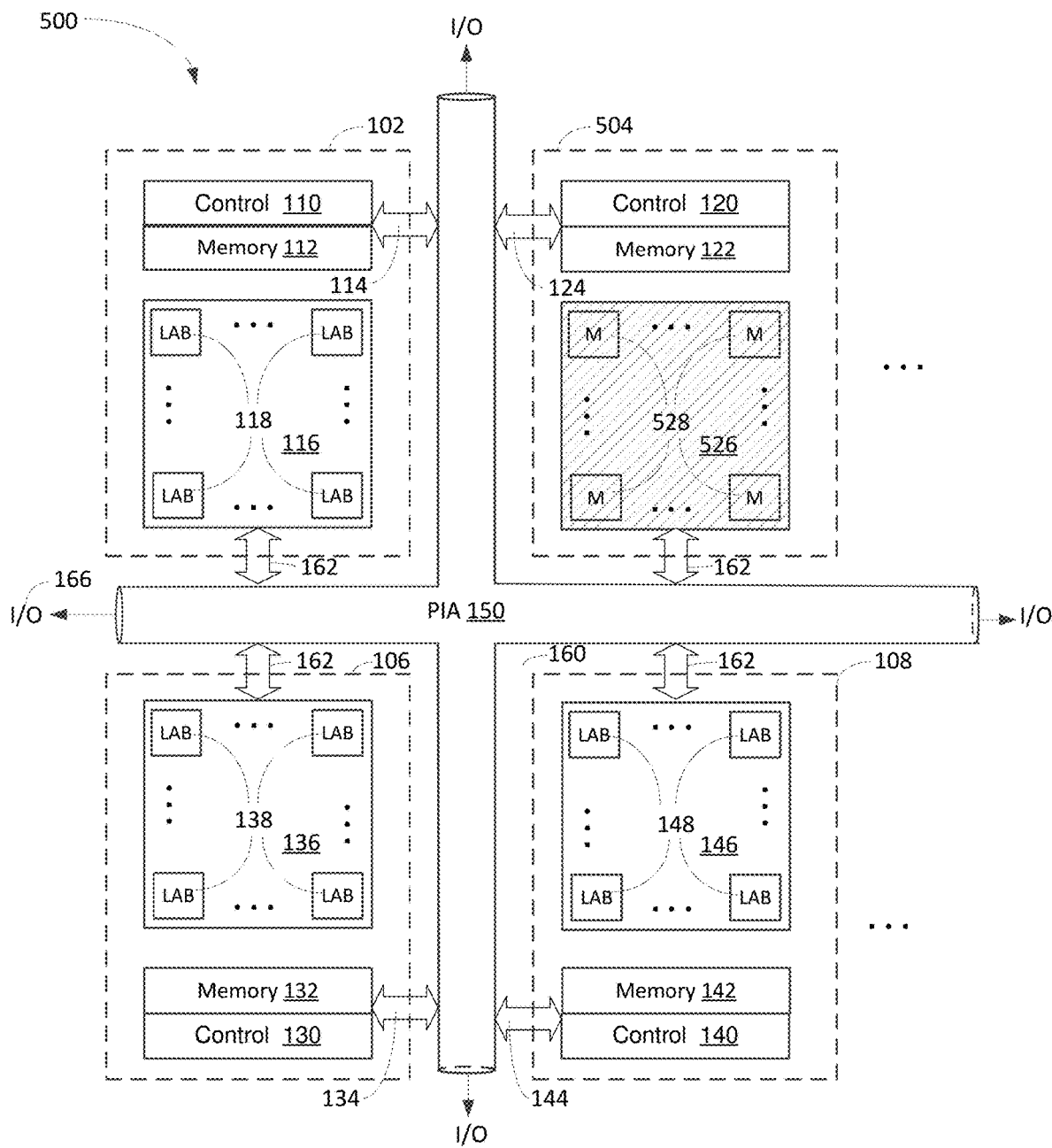
FIG. 5 is a block diagram illustrating PSD containing multiple region able to store large amounts of data internally in its WAN storage in accordance with one embodiment of the present invention.

FIG. 5 is a block diagram 500 illustrating PSD containing multiple regions able to store large amounts of data internally in accordance with one embodiment of the present invention. Diagram 500 is similar to diagram 100, shown in FIG. 1B, except that PPR 504 is configured to be a user memory. Diagram 500 includes multiple PPRs 102-108, 504, and a programmable interconnection array ("PIA") 150, and regional input/output ("I/O") ports 166. PPRs 102-108, 504 further includes control units 110, 120, 130, 140, memory 112 and logic blocks ("LBs") 116, 526, 136, 146. PPRs 102-108, 504 includes LABs 118, 138, 148, and 528. It should be noted that the underlying concept of the exemplary embodiment(s) of the present invention would not change if one or more blocks (circuit or elements) were added to or removed from diagram 500.

PPR 504 includes LB 526, control unit 120, and memory 122. In one embodiment, LB 526 includes an array of NVM LABs 528 such as MRAM LABs. Based on the user's selection, NBM LABs 528 are configured as a random accessible nonvolatile user memory addressed through memory addresses. While PPR 504 is configured to be an NVM for user memory, PPRs 118, 138, and 148 can still be configured to perform user defined logic functions.

Figure 6:
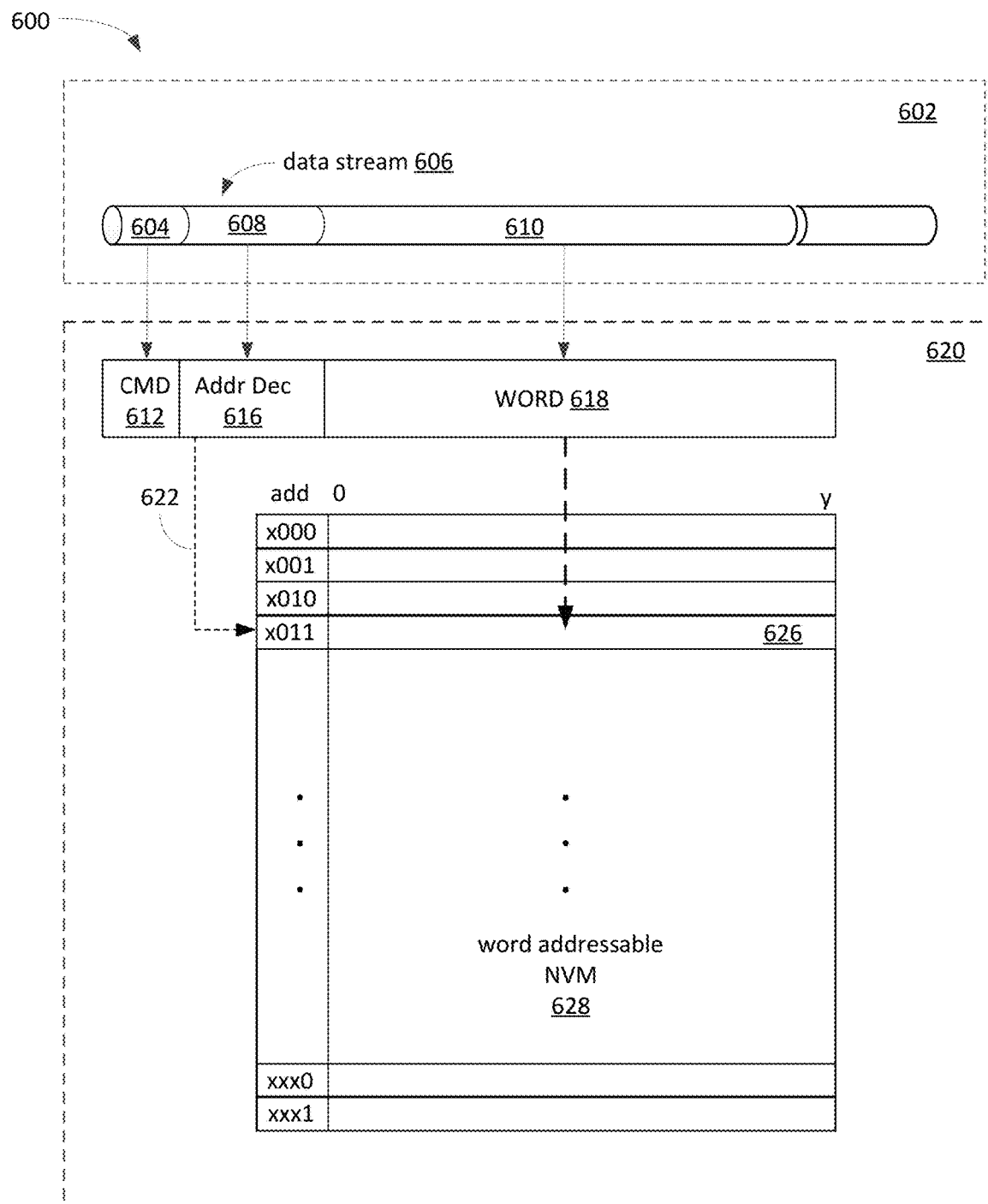
FIG. 6 is a logic diagram illustrating a process of implementing WAN operation in accordance with one embodiment of the present invention.

FIG. 6 is a logic diagram 600 illustrating a process of implementing WAN operation in accordance with one embodiment of the present invention. Diagram 600 illustrates a logic block 602 and a memory block 620. Memory block 620 include MRAM accessible via memory addresses. In one aspect, memory block 620 includes an address decoder 616, Word buffer/decoder 618, command identifier 612, and NVM 628. It should be noted that the underlying concept of the exemplary embodiment(s) of the present invention would not change if one or more blocks (circuit or elements) were added to or removed from diagram 600.

In operation, upon arrival of a data stream 606, a first portion 604 of data stream 606 is forwarded to command identifier 612 to determine the type of memory operation such as, but not limited to, read, write, or read/write operation. A second portion 608 of data stream 606 is forwarded to address decoder 616 to identify the location of the memory. The third portion 610 of data stream 606 is forwarded to word buffer or decoder 618 for preparing a write operation. It should be noted that data stream 606 may be received from external device or host. Alternatively, data stream 606 can be a result from a logic operation performed by logic or configuration block 602.

NVM 628, in one embodiment, is a MRAM organized in an array of word-wide memory storage. In a write operation, the content of word buffer 618 is written into memory location 626 which is addressed by a memory address as indicated by numeral 622. It should be noted that the word width can be 8, 16, 32, 64, 128, or 256 bits wide. In an alternative embodiment, if NVM 628 is a two-port memory, a read and write operation can be performed simultaneously.

Figure 7:
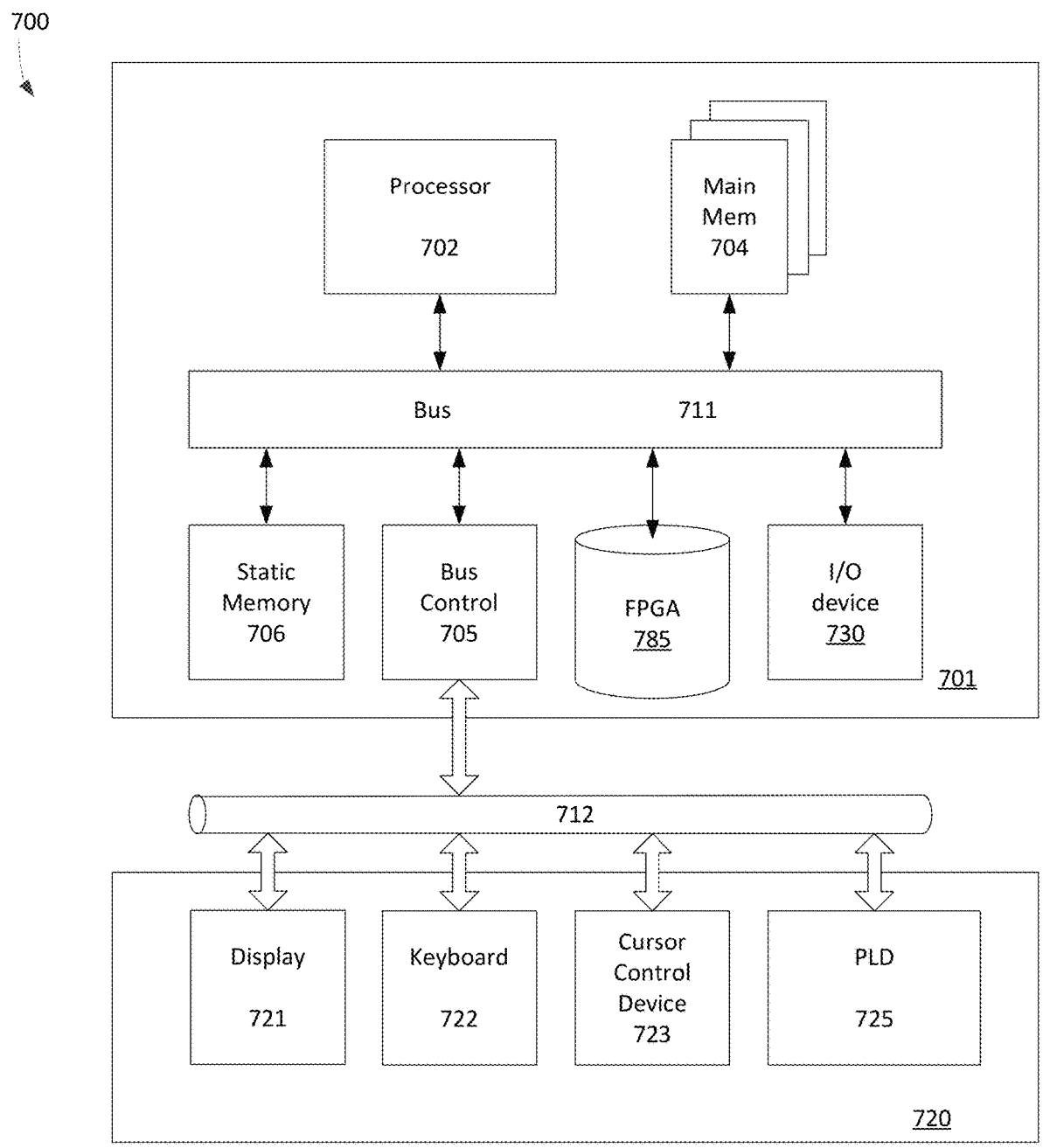
FIG. 7 is a diagram illustrating a system or computer using one or more PSD containing a WAN storage as random access storage in accordance with one embodiment of the present invention.

FIG. 7 is a diagram 700 illustrating a system or computer using one or more PSD containing WAN storages as random access storage in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, I/O element 730, and FPGA 785. It should be noted that the underlying concept of the exemplary embodiment(s) of the present invention would not change if one or more blocks (circuit or elements) were added to or removed from FIG. 7.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and low-power PLD 725. Display device 721 may be a liquid crystal device, cathode ray tube ("CRT"), touch-screen display, or other suitable display device. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other type of cursor for communicating information between system 700 and user(s).

PLD 725 is coupled to bus 712 for providing configurable logic functions to local as well as remote computers or servers through wide-area network. PLD 725 and/or FPGA 785 includes one or more WANs for enhancing memory operation and efficiency. In one example, PLD 725 may be used in a modem or a network interface device for facilitating communication between computer 700 and the network. Computer system 700 may be coupled to a number of servers via a network infrastructure as illustrated in the following discussion.

Figure 8:
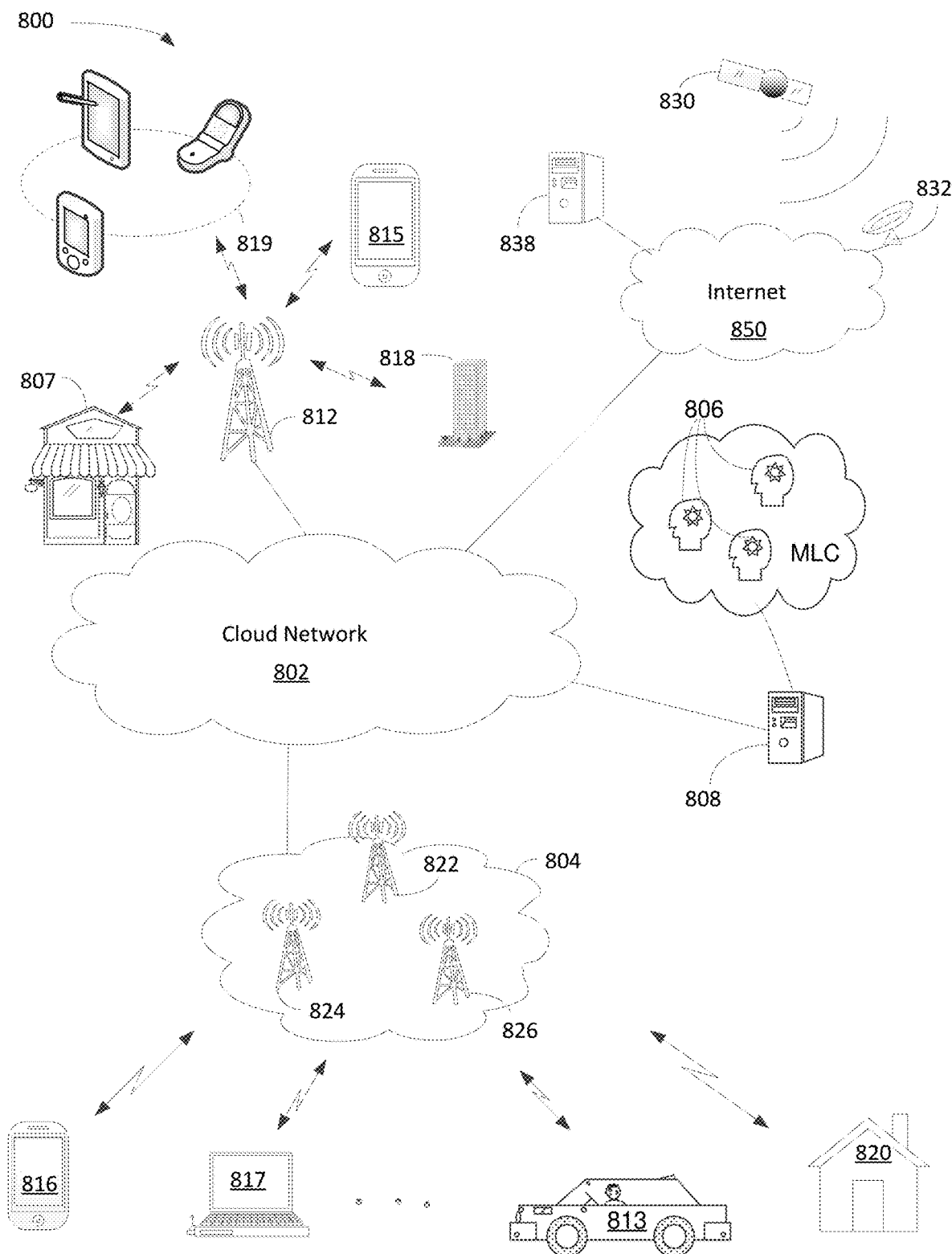
FIG. 8 is a block diagram illustrating various applications of PSD containing FPGA with a WAN storage that can be used in a cloud-based environment in accordance with one embodiment of the present invention.

FIG. 8 is a block diagram illustrating various applications of PSD containing FPGA with WAN storages that can be used in a cloud-based environment in accordance with one embodiment of the present invention. Diagram 800 illustrates AI server 808, communication network 802, switching network 804, Internet 850, and portable electric devices 813-819. In one aspect, PSD having WANs can be used in AI server, portable electric devices, and/or switching network. Network or cloud network 802 can be wide area network, metropolitan area network ("MAN"), local area network ("LAN"), satellite/terrestrial network, or a combination of wide area network, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G ($3^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to a campus, city, metropolitan area, country, continent, or the like.

Base station 812, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 815, laptop computer 817, iPhone® 816, tablets and/or iPad® 819 via wireless communications. Handheld device can also be a smartphone, such as iPhone®, BlackBerry®, Android®, and so on. Base station 812, in one example, facilitates network communication between mobile devices such as portable handheld device 813-819 via wired and wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as global positioning system ("GPS"). It should be noted that WAP can be applied a lot of fields, such as, but not limited to, smartphones 813-819, satellite network 830, automobiles 813, AI server 808, business 807, and homes 820.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 9:
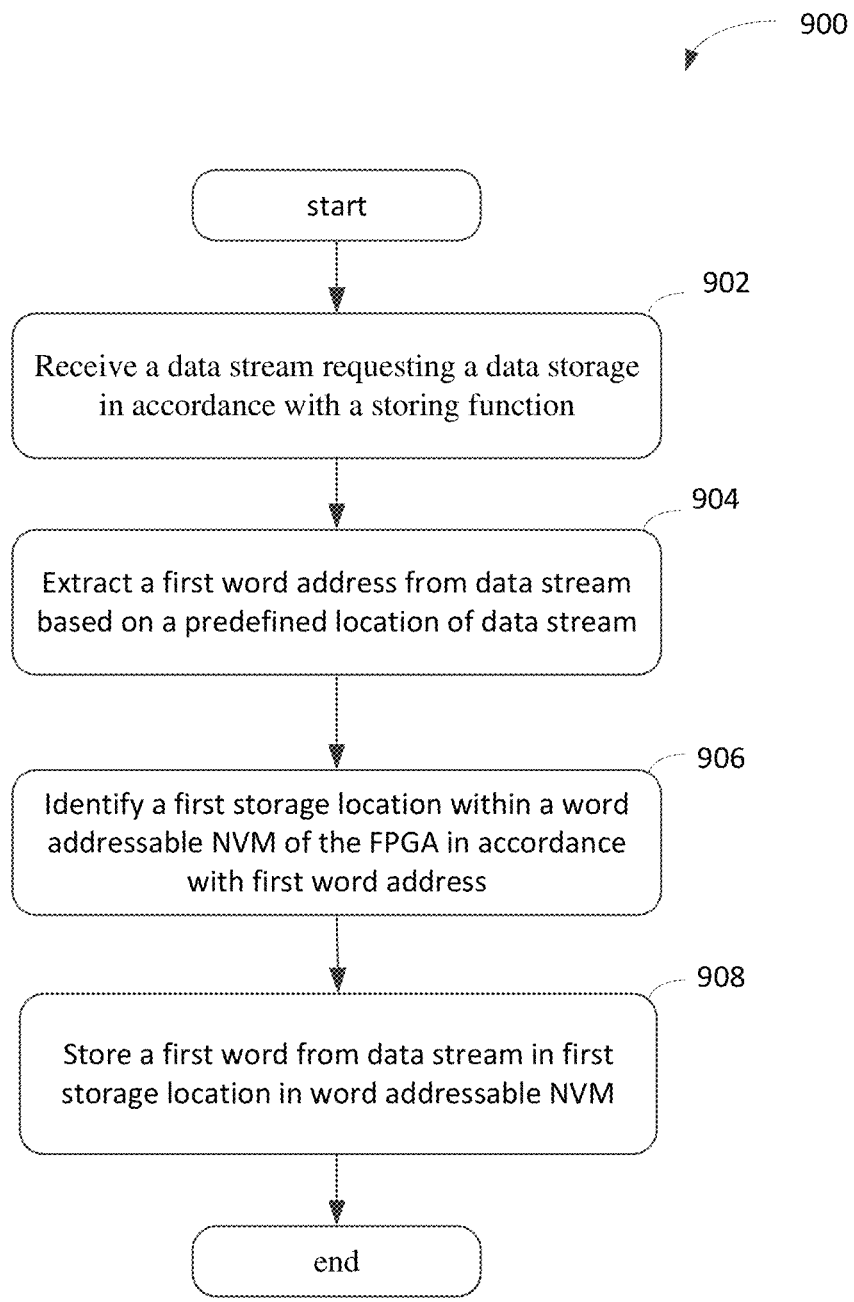
FIG. 9 is a flowchart illustrating a process of implementation of WAN operation in accordance with one embodiment of the present invention.

FIG. 9 is a flowchart illustrating a process of implementation of WAN operation in accordance with one embodiment of the present invention. At block 902, a process of PSD or FPGA containing an WAN receives a data stream requesting a data storage in accordance with a storing function such as a write function.

At block 904, a first word address is extracted from the data stream based on a predefined location of the data stream. In one aspect, a command is separated from the data stream and subsequently passed to a command decoder to determine the operation based on the command.

At block 906, a first storage location is identified within WAN storage of PSD in accordance with the first word address. In one example, a storage location within in a word addressable MRAM is located according to the first word address.

At block 908, the process is capable of storing a first word from the data stream in the first storage location in WAN. For example, the first word of the data stream is stored in the storage location within in the word addressable MRAM. In one embodiment, a first portion of WAN is allocated as a configuration NVM storage for storing configuration data in accordance with user program for facilitating one or more FPGA configurable logic operations. In one aspect, a second word address is extracted from the data stream based on a predefined location of the data stream. The process subsequently allocates a second portion of the WAN as a user NVM storage for storing computation results and user data. It should be noted that the size of the user memory is a function of memory size required by the configuration NVM storage. A second storage location is identified within WAN of FPGA in accordance with the second word address. In one example, the process is able to store a second word containing 64 bits from the data stream in the second storage location in WAN.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A field programmable gate array ("FPGA") containing lookup tables ("LUTs"), comprising:
    a programmable interconnection array ("PIA") containing multiple internal buses configured to selectively route information between logic components and input/output ports based on configuration data;
    a nonvolatile memory ("NVM") coupled to the PIA and configured to be flexibly organized to include a configuration NVM storage and a user NVM storage, wherein the user NVM storage is organized in an array of word-wide memory storage accessible by a memory address operable as random memory access; and
    a first LUT of multiple LUTs in the FPGA, coupled to the PIA, containing a plurality of magnetoresistive random access memory ("MRAM") bits able to persistently store configuration information for configuring the first LUT in response to the configuration data loaded from the configuration NVM storage.

2. The FPGA of claim 1, wherein the first LUT is configured to perform at least a portion of user defined logic functions based on the configuration data.

3. The FPGA of claim 1, wherein the first LUT is configured to perform user storage function for persistently storing results from a user defined logic function.

4. The FPGA of claim 1, further comprising a plurality of configurable logic blocks ("LBs") containing LUTs configured to be selectively programmed to perform one or more logic functions in accordance with the configuration data.

5. The FPGA of claim 1, further comprising a memory block containing a MRAM storage configured to persistently store the configuration data for the FPGA.

6. The FPGA of claim 1, further comprising at least a portion of the LUTs containing MRAM bits configured to be optionally allocated for persistently storing user data for logic operations.

7. A method of configuring a field programmable gate array ("FPGA") containing nonvolatile memory ("NVM") comprising:
    dividing a nonvolatile memory ("NVM") into a configuration NVM storage and a user NVM storage;
    organizing the user NVM storage into an array of word-wide memory storage accessible by a memory address operable as random memory access;

receiving configuration data representing user desirable logic functions for programming at least a portion of the FPGA from a configuration NVM of a NVM storage in the FPGA;

identifying a plurality of NVM bits in one or more lookup tables ("LUTs") within configurable LBs of the FPGA in accordance with the configuration data;

programming logic values to the plurality of NVM bits of the LUTs in response to the configuration data; and facilitating the configurable LBs of the FPGA to carry out the user desirable logic functions based on the logic values in the plurality of NVM bits of the LUTs.

8. The method of claim 7, wherein identifying a plurality of NVM bits includes locating a plurality of magnetoresistive random access memory ("MRAM") bits within a LUT for configuring output of the LUT.

9. The method of claim 7, wherein identifying a plurality of NVM bits includes locating a plurality of flash memory bits within a LUT for configuring output of the LUT.

10. The method of claim 7, wherein identifying a plurality of NVM bits includes locating a plurality of phase-change memory bits within a LUT for configuring output of the LUT.

11. The method of claim 7, wherein identifying a plurality of NVM bits includes locating a plurality of ferroelectric random-access memory ("FeRAM") bits within a LUT for configuring output of the LUT.

12. A field programmable gate array ("FPGA") containing lookup tables ("LUTs"), comprising:

a programmable interconnection array ("PIA") containing multiple internal buses configured to selectively route information between logic components and input/output ports based on configuration data;

a nonvolatile memory ("NVM") coupled to the PIA and configured to be flexibly organized to include a configuration NVM storage for storing the configuration data and a user NVM storage, wherein the user NVM storage is organized in an array of word-wide memory storage accessible by a memory address operable as random memory access; and a first LUT of multiple LUTs in FPGA, coupled to the PIA, containing a plurality of ferroelectric random-access memory ("FeRAM") bits in the first LUT able to persistently store configuration information for configuring the first LUT in response to the configuration data.

13. The FPGA of claim 12, wherein the first LUT is configured to perform at least a portion of user defined logic functions based on the configuration data.

14. The FPGA of claim 12, wherein the first LUT is configured to perform user storage function for persistently storing results from a user defined logic function.

15. The FPGA of claim 12, further comprising a plurality of configurable logic blocks ("LBs") containing LUTs configured to be selectively programmed to perform one or more logic functions in accordance with the configuration data.

16. The FPGA of claim 12, further comprising a memory block containing a magnetoresistive random access memory ("MRAM") storage configured to persistently store the configuration data for the FPGA.

17. The FPGA of claim 12, further comprising at least a portion of the LUTs containing FeRAM bits configured to be optionally allocated for persistently storing user data for logic operations.

* * * * *